United States Patent [19]
Peppiatt et al.

[11] 4,093,914
[45] June 6, 1978

[54] METHOD OF MEASURING PARAMETERS OF A CRYSTAL FILTER

[75] Inventors: Harry J. Peppiatt; Gerald E. Roberts, both of Lynchburg, Va.

[73] Assignee: General Electric Company, Lynchburg, Va.

[21] Appl. No.: 784,970

[22] Filed: Apr. 6, 1977

[51] Int. Cl.² .................. G01R 29/22; G01R 27/26
[52] U.S. Cl. ............................ 324/56; 324/57 SS; 324/80
[58] Field of Search .............. 324/56, 57, 55, 57 Q, 324/80, 81

[56] References Cited

U.S. PATENT DOCUMENTS

| | | | |
|---|---|---|---|
| 2,293,135 | 8/1942 | Hallmark | 324/57 Q |
| 2,944,215 | 7/1960 | Corson | 324/81 |
| 2,991,436 | 7/1961 | Banton | 324/57 SS X |
| 3,397,359 | 8/1968 | Rohde | 324/57 SS |
| 3,445,762 | 5/1969 | Wu | 324/57 SS |
| 3,963,982 | 6/1976 | Roberts | 324/56 |

*Primary Examiner*—Gerard R. Strecker
*Attorney, Agent, or Firm*—James J. Williams

[57] ABSTRACT

Dual resonator crystal filters have an input electrode, a common electrode, and an output electrode which provide two resonators coupled together. Mathematical formulas were derived to determine the resonator frequencies, the synchronous peak separation frequency, and the normalized center frequency. These formulas use selected frequencies or parameters which can be easily measured by applying a variable band of frequencies to the input electrode of a dual crystal filter. Measurements are made of the frequencies at which the voltage at the common electrode is a maximum when the output electrode is connected to the common electrode by capacity and when the output electrode is connected to the common electrode by a short circuit. The measured frequencies can be used in the mathematical formulas to determine the resonator frequencies, the synchronous peak separation frequency, and the normalized center frequency. Other mathematical formulas were also derived to determine the resonator frequencies, the synchronous peak separation frequency, and the normalized center frequency. These other formulas use frequencies at which maximum and minimum voltages are measured when the output electrode is connected to the common electrode by a short circuit.

9 Claims, 5 Drawing Figures

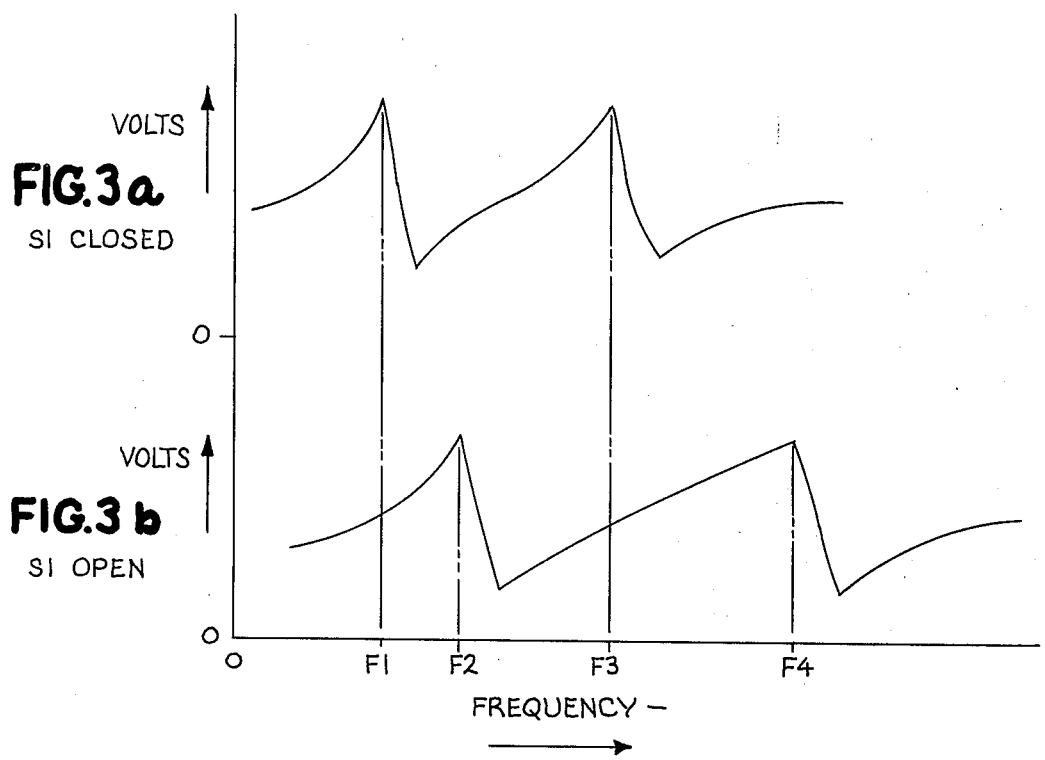
FIG. 3a SI CLOSED
FIG. 3b SI OPEN
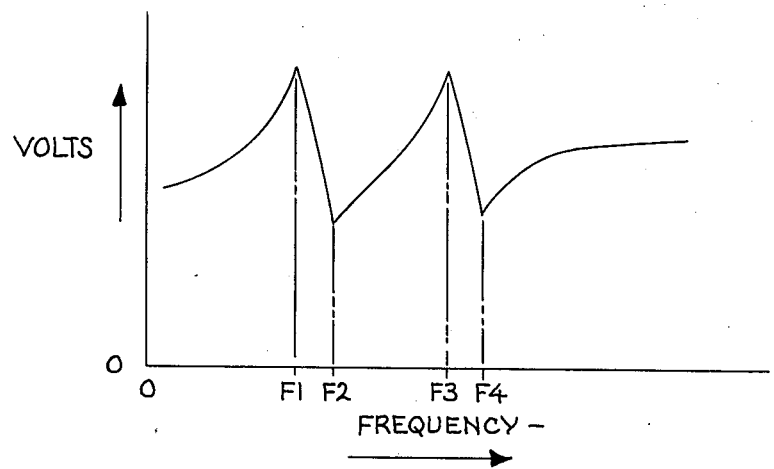
FIG. 4

METHOD OF MEASURING PARAMETERS OF A CRYSTAL FILTER

BACKGROUND OF THE INVENTION

Our invention relates to a method of measuring parameters of a crystal filter, and particularly to a method of measuring parameters of a dual resonator crystal filter to determine the resonator frequencies, the synchronous peak separation frequency, and the normalized center frequency of the filter.

Crystal filters have reached a stage of development where they are used extensively in radio and electronic circuits. Dual or two-resonator crystal filters are preferred in many applications because they provide the characteristics of a very narrow bandpass filter or part of a very narrow filter due to the extremely high Q of the associated crystal resonators. Such very narrow filter characteristics are virtually impossible or extremely difficult to realize with lumped devices, such as inductors and capacitors. The coupled dual crystal filter is comprised of only one plate of piezoelectric material.

Accordingly, a primary object of our invention is to provide a new and improved method of measuring selected parameters of a dual resonator crystal filter.

A typical dual resonator crystal filter includes a plate of piezoelectric material having an input electrode and an output electrode on one face of the plate, and a common electrode on the opposite face of the plate. A coupling strip may be positioned on the one face between the input and output electrodes. The input electrode and common electrode form the first resonator of the filter, and the output electrode and common electrode form the second resonator of the filter. The filtering characteristics of the filter are determined primarily by the resonator frequencies of the first and second resonators, by the synchronous peak separation frequency, and by the normalized center frequency. Synchronous peak separation frequency is defined as the absolute value of the difference between the two short circuit resonant frequencies that would occur if the two resonators were tuned to the same resonant frequency. Where, as is typical, these dual resonator crystal filters are mass produced, a reliable, accurate, and rapid method of determining the filter characteristics of a completed filter is needed.

Accordingly, another object of our invention is to provide a new and improved method of measuring parameters of a dual resonator crystal filter to determine the filtering characteristics of that filter.

Another object of our invention is to provide a new and improved method of measuring the parameters of a dual resonator crystal filter so as to permit the filtering characteristics of the filter to be reliably, accurately, and rapidly determined.

Another and relatively specific object of our invention is to provide a new and improved method for measuring parameters of a dual resonator crystal filter so as to permit the filtering characteristics of such a filter to be reliably, accurately, and rapidly determined by formulas, and without the necessity for adjusting or compensating the measuring device used in our method.

SUMMARY OF THE INVENTION

Briefly, these and other objects are achieved in accordance with our invention by applying a plurality of frequencies to the input electrode of a dual resonator crystal filter relative to a reference point. In our preferred method, the frequencies which cause maximum voltages to be produced at the common electrode are determined both when the common electrode is connected to the output electrode by a capacitor, and by a short circuit. Four voltage maximums are produced by this method, and the four unique applied frequencies which cause these voltage maximums are utilized in mathematical formulas to determine the resonator frequencies, the synchronous peak separation frequency, and the normalized center frequency of the filter. In another embodiment of our invention, the common electrode is connected to the output electrode by a short circuit, and the four frequencies which cause voltage maximums and voltage minimums to be produced at the common electrode are determined. These four frequencies are also utilized in mathematical formulas to determine the resonator frequencies, the synchronous peak separation frequency, and the normalized center frequency of the filter.

BRIEF DESCRIPTION OF THE DRAWING

The subject matter which we regard as our invention is particularly pointed out and distinctly claimed in the claims. The method of our invention, together with further objects and advantages, may be better understood from the following description given in connection with the accompanying drawing, in which:

FIGS. 3a, 3b, and 4 show wave forms for explaining the method in accordance with our invention.

DESCRIPTION OF THE PREFERRED EMBODIMENTS

Figure 1:
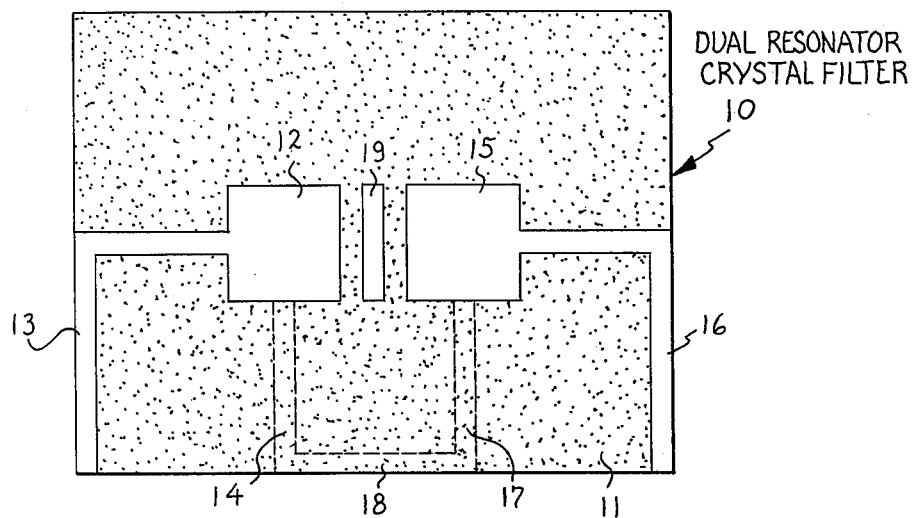
FIG. 1 shows a plan view of a typical dual resonator crystal filter whose parameters are to be measured in accordance with our invention.

The new and improved method of our invention is intended to be used with a dual resonator crystal filter 10, an example of which is shown in the plan view of FIG. 1. The filter 10 is formed of a rectangular plate 11 of piezoelectric material. An input electrode 12 and an output electrode 15 are applied to the upper surface of the plate 11, and electrical connections for these electrodes are provided by leads 13, 16 respectively. A common electrode or electrodes is positioned on the opposite or lower face of the plate 11, and these electrodes may have a configuration that corresponds to the input and output electrodes 12, 15 respectively. Or, the common electrode may be a single continuous electrode which occupies all of the area corresponding to the area of the electrodes 12, 15 as well as the area between those electrodes 12, 15. Electrical connections for the common electrode or electrodes is provided by the leads 14, 17 respectively on the opposite face of the plate 11. These leads 14, 17 are usually connected by a common lead 18. The input electrode 12 and the common electrode form a resonator A, and the output electrode 15 and the common electrode form a resonator B. Alternating current signals applied to the leads 13, 18 cause the piezoelectric material in resonator A to mechanically vibrate. These vibrations cause vibration in the resonator B. Vibrations in the resonator B produce voltages at the output electrode 15 and the common electrode, and these voltages can be derived at the leads 16, 18. The piezoelectric material has resonant properties such that only a narrow band of signals is passed between the input leads 13, 18 and the output leads 16, 18. The resonant frequency of each of the resonators A and B is determined in part by the mass loading of the material comprising the electrodes, and the shape of the passband is determined in part by the number of resonators. The degree of coupling between the resonator A and the resonator B varies as an inverse function of the separation between the input and output electrodes 12, 15. This effective separation can be increased (to decease the coefficient of coupling) by reducing the area of the coupling strip 19 which is typically positioned on only one side of the plate 11.

When a filter 10 as shown in FIG. 1 has been completed, it is desirable to know certain of its filtering characteristics. Among those desired characteristics are the resonant frequency of the resonator A, the resonant frequency of the resonator B, and the normalized center frequency of the filter 10. It is also desirable to know the synchronous peak separation frequency, which we define as the absolute value of the difference between the two short circuit resonant frequencies that would occur if the two resonators were tuned to the same resonant frequency. While various schemes for determining these characteristics have been provided, they do not always lend themselves to mass production techniques. For example, U.S. Pat. Nos. 3,963,982 and 3,992,760 show apparatus and a method for measuring characteristics of a crystal filter. While such apparatus and method do provide certain desired measurements, they require parallel resonant circuits having a selected resonant frequency characteristic which is related to or dependent upon the characteristics of the crystal filter. Thus, if a variety of crystal filters are to be measured, the resonant circuits must be adjusted in order to give desirably accurate results.

To overcome these and other disadvantages of prior devices, we have derived preferred mathematical expressions or formulas which provide the desired characteristics of a dual frequency crystal filter. These formulas are as follows:

$$FA = \left[ \frac{F2^2 F4^2 - F1^2 F3^2}{F2^2 + F4^2 - F1^2 - F3^2} \right]^{\frac{1}{2}}$$ (Formula 1)

$$FB = [F1^2 + F3^2 - FA^2]^{\frac{1}{2}}$$ (Formula 2)

$$NCF = [F1\, F3]^{\frac{1}{2}}$$ (Formula 3)

$$DF = \left[ \frac{FA^2 FB^2 - F1^2 F3^2}{F1\, F3} \right]^{\frac{1}{2}}$$ (Formula 4)

Figure 2:
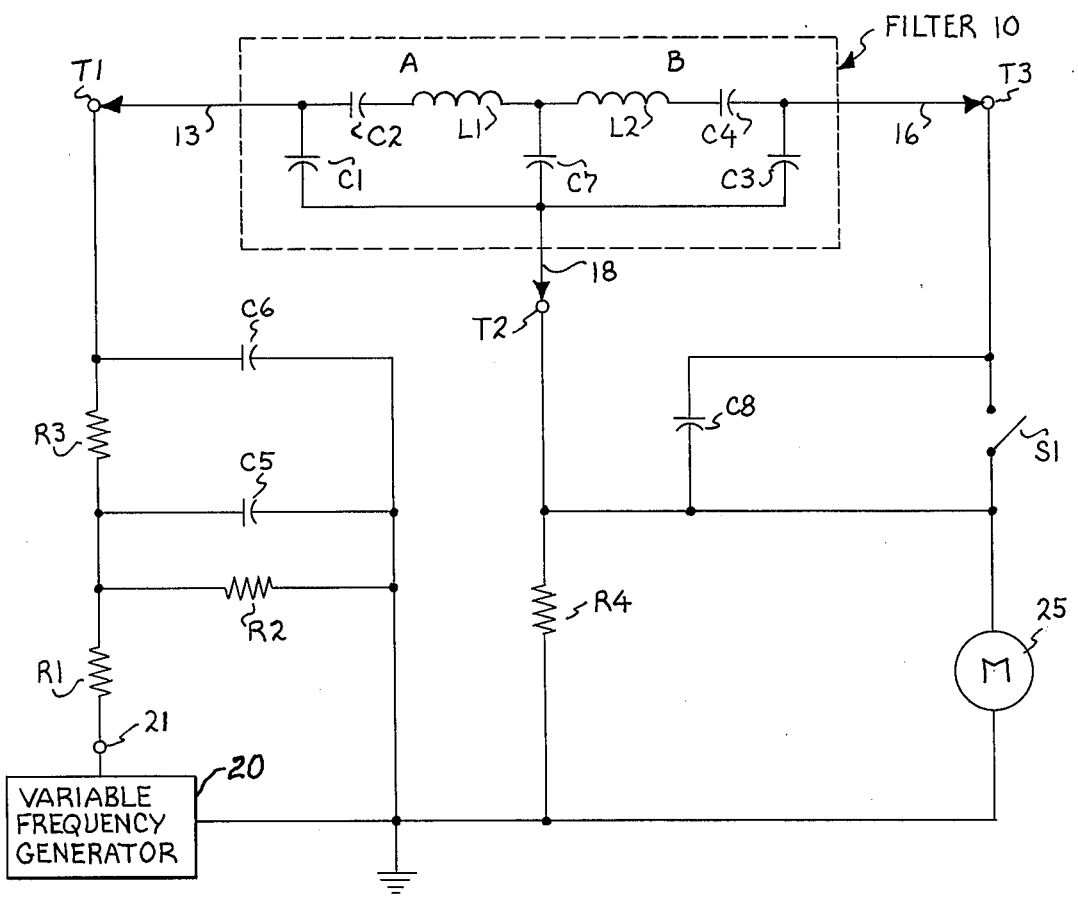
FIG. 2 shows an electrical circuit diagram of apparatus for measuring the parameters of a dual resonator crystal filter in accordance with the method of our invention.

In these formulas, FA is the resonator A frequency, FB is the resonator B frequency, NCF is the normalized center frequency, and DF is the synchronous peak separation frequency if both resonators were tuned to the normalized center frequency. The frequencies F1, F2, F3, and F4 are the parameters which are measured in accordance with the preferred method of our invention as will be explained. FIG. 2 shows an electrical circuit diagram of apparatus for measuring the parameters (namely F1, F2, F3, and F4) of a dual resonator crystal filter in accordance with our invention. In FIG. 2, an equivalent electrical circuit of the filter 10 is shown enclosed in dashed lines. The resonator A includes a terminal and static capacitor C1 which appears electrically between the input lead 13 and common lead 18. The capacitor C1 has a substantially fixed value for a given resonator. The motional or piezoelectric part of the resonator A is represented by a motional capacitor C2 connected in series with a motional inductor L1. The equivalent circuit for the resonator B is substantially similar, and includes a terminal and static capacitor C3 between the output lead 16 and the common lead 18. A motional capacitor C4 is connected in series with a motional inductor L2. A capacitor C7 represents the motional coupling between the resonators A and B.

In order to measure the four parameters F1, F2, F3, and F4, we provide a variable frequency generator or oscillator 20 which can be swept over the desired band of frequencies. The output of the generator 20 is produced at a terminal 21 with respect to a point of reference potential or ground. The terminal 21 is connected to an attenuator pad at one end of a resistor R1. The other end is connected to ground through a capacitor C5 and a resistor R2. The other end of the resistor R1 is also connected to one end of a further resistor R3. The other end is connected to ground by a capacitor C6. The other end of the resistor R3 (which is the attenuator pad output) is connected to a first fixture or apparatus terminal T1. A second fixture or apparatus terminal T2 is provided, and this terminal T2 is connected through a resistor R4 to ground. A suitable voltage indicating device 25 is connected across the resistor R4. A third fixture or apparatus terminal T3 is provided, and this terminal T3 is connected to one end of a capacitor C8 and a switch S1. The other end of the capacitor C8 and switch S1 are connected to the terminal T2.

When the parameters of the filter 10 are to be measured by our preferred method, the filter 10 has its input lead 13 connected to the fixture terminal T1, its common lead 18 connected to the fixture terminal T2, and its output lead 16 connected to the fixture terminal T3. The switch S1 is then closed to short-circuit the output electrode to the common electrode, and the generator 20 swept in frequency. The indicating device 25 is observed for voltage maximums (between the common electrode and ground), and the two frequencies which cause these voltage maximums are measured or recorded. These two frequencies are designated F1 and F3 in the wave form of FIG. 3a, which shows the voltage changes indicated by the device 25 as the frequency is swept. Thereafter, the switch S1 is opened, and the generator 20 swept with only the capacitor C8 present between the output and common electrodes. Again, the voltage maximums (between the common electrode and ground) are determined by the device 25, and the two frequencies which produce these maximums are measured or recorded. These two frequencies are designated F2 and F4 in FIG. 3b, which shows the voltage changes indicated by the device 25 as the frequency is swept.

After the parameters F1, F2, F3, and F4 are measured, they are then used in Formula 1 to calculate the resonator A frequency FA. Then, the parameters F1 and F3 and the calculated frequency FA are used in Formula 2 to calculate the resonator B frequency FB. Then the parameters F1 and F3 are used in Formula 3 to calculate the normalized center frequency NCF of the filter. And finally, the parameters F1 and F2 and the calculated frequencies FA and FB are used in Formula 4 to calculate the synchronous peak separation frequency DF. The significance of synchronous peak separation frequency is that it can provide a common reference value at a particular point in the process of a specific nominal crystal design for evaluating the acoustic coupling of each crystal in a group of crystals. The synchronous peak separation frequency has meaning in that it represents a value or number which can be related mathematically to the coupling capacitor in the equivalent circuit of the crystal. It also provides a convenient measure of a specific crystal's coupling capability, as related to the nominal design independent of the actual variations in resonator frequencies of the crystal, since the number is calculated under the mathematical conditions that FA = FB = NCF (as defined in Formulas 1, 2 and 3). The value of the synchronous peak separation frequency is that it provides a quantitative method for maintaining process control over the fabrication of crystals for a specific coupled-dual crystal design as related to acoustic coupling of the crystals, since this coupling for each crystal is related mathematically to standard or common conditions.

As will be seen, the calculated values FA, FB, NCF, and DF obtained with Formulas 1, 2, 3, and 4 are not directly dependent on the measuring circuit component values or characteristics. That is, the values require only the measured frequencies. For example, the calculated values FA, FB, NCF, and DF are not dependent upon the magnitude of the static capacitance C3. In other measurement methods capacitor C3 might have to be measured directly. Also, since capacitor C8 is in parallel with capacitor C3, its value is not important in the calculation. However, there are situations in which the frequency difference between F3 and F4 can be quite large compared to the differences between F1 and F3 if capacitor C8 were not in the circuit. In addition, the peak voltage at F4 may be substantially lower than the peak voltage at F1 and F3. For convenience of measuring the four peaks, a choice of the value of capacitor C8 can be made which will bring F4 closer to F3 to produce a voltage peak at F4 on the same order of magnitude as F3. In addition, this choice of capacitance C8 reduces the frequency range over which the generator must be swept to allow F4 to be determined. However, capacitor C8 should not be so large that it approaches a short circuit at the frequencies of interest. Thus, the accuracy of the calculations is as good as the measurements of the indicating device 25 and the frequencies produced by the generator 20. Typically, these measured values are sufficiently accurate for most mass production techniques, so that the characteristics (namely the resonator frequencies, the synchronous peak separation frequency, and the normalized center frequency) can be easily and accurately determined. Persons skilled in the art will appreciate that the method and techniques described above lend themselves to automatic programming. Thus, a filter 10 can be inserted in the fixture, the frequencies automatically swept, the maximum voltages indicated and the frequencies measured, and a calculation based on the Formulas 1, 2, 3, and 4 automatically made by a computer or similar device. These values can then be used to indicate whether the filter is within the desired limits or tolerances. Persons skilled in the art will also appreciate that the frequencies F2 and F4 can be determined first, and the frequencies F1 and F3 determined second. This is simply a matter of preference or choice.

In addition to our preferred method described above, we have also provided a second method. This second method provides parameters for the following mathematical formulas:

$$FB = \left[ \frac{F2^2 F4^2 - F1^2 F3^2}{F2^2 + F4^2 - F1^2 - F3^2} \right]^{\frac{1}{2}}$$ (Formula 5)

$$FA = [F1^2 + F3^2 - FB^2]^{\frac{1}{2}}$$ (Formula 6)

$$DF = \left[ \frac{FA^2 FB^2 - F1^2 F3^2}{F1\, F3} \right]^{\frac{1}{2}}$$ (Formula 7)

In these formulas, FA, FB, and DF are as defined above. The frequencies F1, F2, F3, and F4 are parameters measured in accordance with this second embodiment of our invention. With reference to FIG. 2, the same circuit may be provided and a crystal connected to it. The switch S1 is closed, and the generator 20 swept. With reference to FIG. 4, the two frequencies F1 and F3 are measured when the device 25 shows maximum voltages, and the two frequencies F2 and F4 are measured when the device 25 shows minimum voltages. Thus in this embodiment, all of the necessary parameters can be measured with the switch S1 closed. These parameters are used in Formula 5 to calculate the resonator B frequency FB. The parameters and the calculated frequency FB are used in Formula 6 to calculate the resonator A frequency FA. The parameters and the calculated frequencies FA and FB are used in Formula 7 to calculate the synchronous peak separation frequency DF. The normalized center frequency NCF can be calculated with the parameters F1 and F3 and Formula 3. As in our preferred method, there are situations in which the frequency difference between F3 and F4 can be quite large compared to the difference between F1 and F3. A capacitance can be placed in parallel with capacitor C1 to cause F4 to occur closer to F3 as a matter of convenience of measuring. This added capacitor should not be so large that it approaches a short circuit at the frequencies of interest. While the method in accordance with the wave form of FIG. 4 provides good and accurate results, we prefer the method using the wave forms of FIGS. 3a and 3b, since it is easier and more accurate to determine voltage maximums than it is voltage minimums.

As an example of our preferred method using the wave forms of FIGS. 3a and 3b, a dual resonator crystal filter 10 was constructed with a design to have the following characteristics:
 FA: 9,404,000 Hz
 FB: 9,396,000 Hz
 DF: 10,038 Hz
 NCF: 9,399,996 Hz This filter was measured in accordance with the preferred method of our invention. The generator 20 was swept over a band of frequencies between 9,390,000 and 9,410,000 Hz, and this gave the following measured parameters:
 F1: 9,393,505 Hz; Switch S1 closed
 F3: 9,406,402 Hz; Switch S1 closed
 F2: 9,396,488 Hz; Switch S1 open; C8: 5 mmfds
 F4: 9,407,332 Hz; Switch S1 open; C8: 5 mmfds These parameters were used in Formulas 1, 2, 3, and 4, and the A resonator frequency FA was calculated to be 9,404,044 Hz, the B resonator frequency FB was calculated to be 9,395,865 Hz, the normalized center frequency was calculated to be 9,399,951 Hz, and the synchronous peak separation frequency was calculated to be 9972 Hz. With these calculations, it could be easily determined whether the crystal was inside or outside of tolerance.

While we have shown a preferred embodiment and an additional embodiment, persons skilled in the art will appreciate that variations can be provided for our invention. The apparatus for using our method may take many forms, including various types of variable frequency generators, various indicating devices, various input networks and associated circuits, and automated associated equipment. And in particular, we have found that a wide range of values may be used for the capacitor C8. Therefore, while our invention has been described with reference to particular embodiments, it is to be understood that modifications may be made without departing from the spirit of the invention or from the scope of the claims.

What we claim as new and desire to secure by Letters Patent of the United States is:

1. A method of measuring selected parameters of a crystal filter having a piezoelectric plate, an input electrode on said plate, a common electrode on said plate, and an output electrode on said plate, said method comprising the steps of:
   a. applying a plurality of frequencies to said input electrode relative to a reference point while said output electrode and said common electrode are connected by a short circuit and determining the frequencies which cause the voltage at said common electrode relative to said reference point to be a maximum; and
   b. applying a plurality of frequencies to said input electrode relative to said reference point while said output electrode and said common electrode are connected by a capacitor and determining the frequencies which cause the voltage at said common electrode relative to said reference point to be a maximum.

2. The method of claim 1 wherein said capacitor does not present a short circuit at said plurality of frequencies.

3. A method of determining selected parameters of a crystal filter having a piezoelectric plate, an input electrode on said plate, a common electrode on said plate, and an output electrode on said plate, said method comprising the steps of:
   a. connecting a variable frequency signal generator to said input electrode and to a reference point;
   b. connecting a voltage indicating device between said common electrode and said reference point;
   c. measuring the two frequencies produced by said signal generator when said voltage indicating device indicates a maximum voltage and while said output electrode is connected to said common electrode by capacity; and
   d. measuring the two frequencies produced by said signal generator when said voltage indicating device indicates a maximum voltage and while said output electrode is connected to said common electrode by a short circuit.

4. The method of claim 3 wherein said capacity does not present a short circuit at said two frequencies.

5. A method of measuring selected parameters of a crystal filter having a piezoelectric plate, an input electrode mounted on one side of said plate, an output electrode mounted on said one side of said plate and spaced from said input electrode, and a common electrode mounted on an opposite side of said plate, said method comprising the steps of:
   a. connecting a source of signals, which can be swept in frequency, to said input electrode and a reference point;
   b. connecting a voltage measuring device to said common electrode and said reference point;
   c. sweeping the frequency of said source of signals; and
   d. measuring the frequencies at which said voltage measuring device indicates a maximum during the time said output electrode is connected to said common electrode by capacity and during the time said output electrode is connected to said common electrode by a short circuit.

6. The method of claim 5 wherein said capacity does not present a short circuit at said frequencies of measurement.

7. A method of measuring selected parameters of a crystal filter having a piezoelectric plate, an input electrode on said plate, a common electrode on said plate, and an output electrode on said plate, said method comprising the steps of:
   a. applying a band of frequencies to said input electrode relative to a reference point while said output electrode and said common electrode are connected by a short circuit; and
   b. determining the frequencies which cause the voltage at said common electrode relative to said reference point to be a maximum and a minimum.

8. A method of measuring selected parameters of a crystal filter having a piezoelectric plate, an input electrode on said plate, a common electrode on said plate, and an output electrode on said plate, said method comprising the steps of:
   a. applying a band of frequencies to said input electrode relative to a reference point while said output electrode and said common electrode are connected by a short circuit;
   b. measuring the two frequencies which cause the voltage at said common electrode relative to said reference point to be a maximum; and
   c. measuring the two frequencies which cause the voltage at said common electrode relative to said reference point to be a minimum.

9. A method of measuring selected parameters of a crystal filter having a piezoelectric plate, an input electrode mounted on one side of said plate, an output electrode mounted on said one side of said plate and spaced from said input electrode, and a common electrode mounted on an opposite side of said plate, said method comprising the steps of:
   a. connecting a source of signals, which can be swept in frequency, to said input electrode and a reference point;
   b. connecting a voltage measuring device to said common electrode and said reference point;
   c. short-circuiting said output electrode and said common electrode; and
   d. measuring the frequencies at which said voltage measuring device indicates a maximum and a minimum while said source of signals are swept in frequency.

* * * * *